United States Patent
Kasper et al.

(10) Patent No.: US 8,519,732 B2
(45) Date of Patent: Aug. 27, 2013

(54) METHOD FOR SELF-MONITORING OF BREAKDOWN IN SEMICONDUCTOR COMPONENTS AND SEMICONDUCTOR COMPONENT CONSTRUCTED THEREOF

(75) Inventors: Erich Kasper, Pfaffenhofen (DE); Michael Morschbach, Stuttgart (DE)

(73) Assignee: Universitat Stuttgart, Stuttgart (DE)

( * ) Notice: Subject to any disclaimer, the term of this patent is extended or adjusted under 35 U.S.C. 154(b) by 545 days.

(21) Appl. No.: 12/448,978

(22) PCT Filed: Jan. 11, 2008

(86) PCT No.: PCT/DE2008/000047
§ 371 (c)(1),
(2), (4) Date: Nov. 20, 2009

(87) PCT Pub. No.: WO2008/086776
PCT Pub. Date: Jul. 24, 2008

(65) Prior Publication Data
US 2010/0097084 A1 Apr. 22, 2010

(30) Foreign Application Priority Data
Jan. 19, 2007 (DE) .......................... 10 2007 002 820

(51) Int. Cl.
*G01R 31/02* (2006.01)

(52) U.S. Cl.
USPC ................................ 324/762.03; 324/762.01

(58) Field of Classification Search
USPC ....................................... 324/762.01–762.09
See application file for complete search history.

(56) References Cited

U.S. PATENT DOCUMENTS

| | | | |
|---|---|---|---|
| 6,097,748 A | 8/2000 | Huang et al. | |
| 6,233,127 B1 | 5/2001 | Shimazawa | |
| 6,483,327 B1 * | 11/2002 | Bruce et al. | 324/762.03 |
| 6,894,518 B1 * | 5/2005 | Bruce et al. | 324/754.27 |
| 6,956,365 B2 * | 10/2005 | Niv et al. | 324/750.02 |
| 8,107,057 B2 * | 1/2012 | Audier et al. | 356/5.01 |
| 8,232,817 B2 * | 7/2012 | Kamieniecki | 324/754.23 |
| 8,456,186 B2 * | 6/2013 | Takekoshi et al. | 324/762.01 |
| 2006/0193356 A1 * | 8/2006 | Osiander et al. | 372/38.01 |
| 2006/0194382 A1 | 8/2006 | Hayashi | |
| 2012/0235701 A1 * | 9/2012 | Levermore et al. | 324/762.01 |

FOREIGN PATENT DOCUMENTS

| | | |
|---|---|---|
| DE | 36 22 879 C2 | 4/1997 |
| JP | 02 159995 A | 6/1990 |

* cited by examiner

*Primary Examiner* — Joshua Benitez-Rosario
(74) *Attorney, Agent, or Firm* — Merek, Blackmon & Voorhees, LLC

(57) ABSTRACT

The invention relates to a method for monitoring the breakdown of a pn junction in a semiconductor component and to a semiconductor component adapted to carrying out said method. According to the method, optical radiation which is emitted if a breakdown occurs on a pn junction is detected by a photosensitive electronic component (8) integrated into the semiconductor component. The supply of the pn junction is controlled according to the detected radiation to prevent a complete breakdown during operation of the semiconductor component. The method according to the invention and the semiconductor component adapted thereto permit the operating range of the semiconductor component to be extended and the power output to be increased without the risk of destruction.

19 Claims, 1 Drawing Sheet

Figure 1:
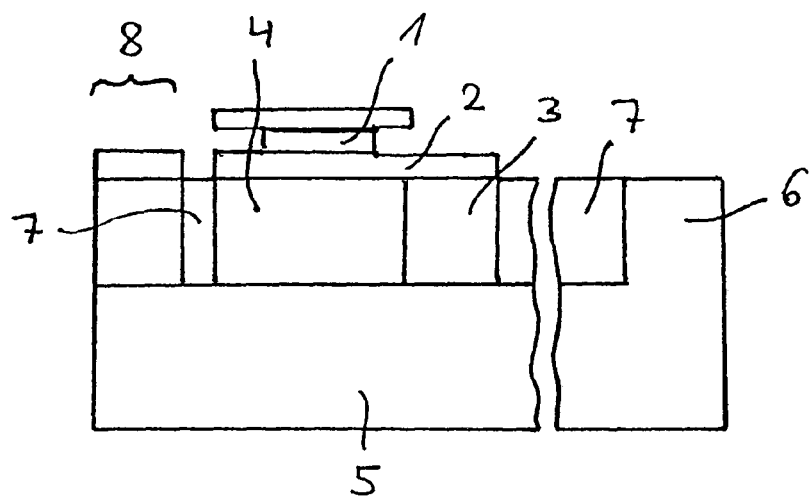

METHOD FOR SELF-MONITORING OF BREAKDOWN IN SEMICONDUCTOR COMPONENTS AND SEMICONDUCTOR COMPONENT CONSTRUCTED THEREOF

TECHNICAL FIELD OF APPLICATION

The present invention relates to a method for the monitoring of the breakdown of pn-junctions in semiconductor components and also a semiconductor component constructed for the application of the method. A semiconductor component can in this case comprise one or a plurality of semiconductor components, such as for example diodes or transistors. The method is primarily suitable for the self-monitoring of breakdown in fast integrated circuits (ICs) and in fast semiconductor components.

PRIOR ART

Fast integrated circuits and fast semiconductor components exhibit an early breakdown. In the present patent application, the term breakdown designates avalanche breakdown at a pn-junction, which occurs starting from a certain voltage applied at the pn-junction or starting from a certain electric field strength (critical field strength) in the space charge region. A severely limited operating range results for these ICs and semiconductor components due to the early breakdown.

Hitherto, the breakdown can only be prevented by means of external voltage or current limitation. A fixed limiting of this type must start early, however, in order to take account of individual variations in the electrical characteristics of the semiconductor component and temperature effects. This additionally reduces the size of the operating range and reduces the power utilisation as a result. The breakdown can destroy the component and the integrated circuit.

US-2006/0194382 A1 discloses a method for creating an ESD protection circuit for a semiconductor component which is integrated into the semiconductor component. A physical analysis of the elements of the protection circuit is carried out for determining the parameters necessary for the creation of the protection circuit, which analysis comprises a measurement of the breakdown characteristic of the MOSFETs used as well as an analysis of the photoemission, among other things.

DESCRIPTION OF THE INVENTION

The object of the present invention consists in specifying a real-time method for the monitoring of the breakdown of pn-junctions in semiconductor components and also a semiconductor component constructed for the carrying out of the method, which semiconductor component allows an enlarged operating range of the semiconductor component.

The object is achieved with the method and the semiconductor component according to the patent claims 1 and 7. Advantageous configurations of the method as well as of the semiconductor component are the subject of the subclaims or can be drawn from the following description as well as from the exemplary embodiment.

In the case of the suggested method for monitoring the breakdown of pn-junctions in semiconductor components, optical radiation, which the pn-junction emits during a breakdown, is detected with a photosensitive electronic component integrated into the semiconductor component in the vicinity of the pn-junction. A voltage applied at the pn-junction or a current conducted across the pn-junction is then controlled in dependence on this radiation detected. The control can take place in such a manner that a complete breakdown of the pn-junction is prevented. In the event of the optical emission of the pn-junction increasing beyond a predeterminable threshold, the current or the voltage at the pn-junction is in this case reduced until the optical emission has once again fallen under the threshold value or does not increase any further. In this context, what is meant by a complete breakdown is a breakdown with a duration which leads to overheating or destruction of the semiconductor component.

The suggested semiconductor component comprises at least the pn-junction to be monitored, a control unit for controlling a voltage applied at the pn-junction or a current conducted across the pn-junction and a photosensitive electronic component connected to the control unit. The photosensitive component is in this case integrated in the vicinity of the pn-junction in such a manner that it can detect optical radiation emitted during a breakdown at the pn-junction. The control unit is constructed such that it controls the voltage applied at the pn-junction or the current conducted across the pn-junction in dependence on the radiation detected.

The present method enables the self-monitoring of the breakdown at a pn-junction in a semiconductor component without further limiting the operating range of the semiconductor component as a result. Rather, the semiconductor component can thereby be operated with voltages or currents shortly before the onset of the breakdown, so that an increased power output can be achieved. The method is suitable here in particular for the self-monitoring of breakdown in fast ICs and fast semiconductor components during their normal use. Essential advantages of the method and of the semiconductor component therefore consist in an enlarged operating range and an increased power of the semiconductor component, in a larger temperature range for operation, a larger acceptance of component strays and protection against destruction and therefore failure of the semiconductor component.

In the case of the present method and the semiconductor component configured therefor, use is made of the discovery that visible light is emitted during the breakdown of a pn-junction. The light emission increases as the breakdown progresses, so that it can be used as a signal for the starting breakdown and also as a measure for a continuing breakdown. In the case of the present method and the associated semiconductor component, a photosensitive electronic component, preferably a photodiode, is therefore integrated into the semiconductor component close to the generating location for the light emission, that is to say close to the pn-junction to be monitored. The location of this photosensitive component must in this case be selected to be sufficiently close to the pn-junction as the light emission is only weak and is additionally absorbed strongly in the semiconductor material. The signal measured by the photosensitive component, the photocurrent in the case of the photodiode, is used to control the supply (voltage, current) of the component or pn-junction to be protected.

In the case of the method suggested, the weak light emission during the breakdown of a pn-junction, which was hitherto treated as useless, is thus used as a self test for the breakdown during the operation of the semiconductor component. The photosensitive component integrated to this end serves the detection of this light emission exclusively for the control of the supply of the monitored semiconductor component.

It is self evident that a plurality of pn-junctions in a semiconductor component, for example a complex integrated circuit, can also be monitored with the method suggested. In this case, a corresponding photosensitive component is integrated at every pn-junction to be monitored and connected to a control unit which controls the supply of the semiconductor component of the pn-junction monitored.

The component to be controlled can for example be a bipolar transistor, a heterobipolar transistor (HBT) or a field effect transistor (FET), particularly a MOSFET. In the case of a field effect transistor, preferably the control signal of the control unit is used to control the source bulk or source drain or gate source voltage.

No particular requirements are placed on the control unit itself. This control unit must merely be fast enough to be able to control the voltage or the current in order to prevent the breakdown. A PI or a PID control can be used here by way of example as control techniques. The control unit itself is in this case preferably likewise monolithically integrated into the semiconductor component, as is also the case for the photosensitive component.

SHORT DESCRIPTION OF THE DRAWINGS

Figure 2:
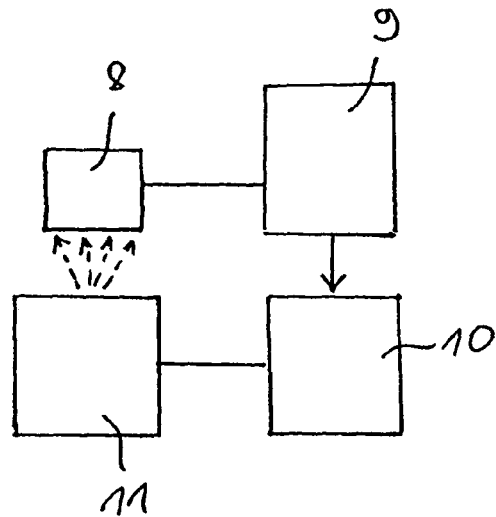

The suggested method and also the semiconductor component are explained briefly once more below with reference to an exemplary embodiment in connection with the drawings. Here:

FIG. 1 shows an example for the integration of a photodiode into a heterobipolar transistor for carrying out the suggested method; and FIG. 2 schematically shows the principal construction of a semiconductor component according to the present invention.

WAYS OF REALISING THE INVENTION

In the following example, the suggested method as well as the construction of a correspondingly configured semiconductor component is once more explained using the example of a heterobipolar transistor. The breakdown of the pn-junction in the heterobipolar transistor should in this case be monitored by the semiconductor component itself during the normal operation of this transistor, in order to prevent a breakdown during operation. In the case of the method, an in-situ detection takes place of the light which is emitted at the pn-junction by the semiconductor material in the avalanche breakdown. This illumination is converted to a photocurrent with a monolithically integrated photodetector which is placed close to the pn-junction. The photocurrent is used as a control signal for the supply of the heterobipolar transistor.

The known construction of a heterobipolar transistor, with the emitter 1, the base 2, the collector 3, the SIC region 4 (SIC=Selectively Implanted Collector), the subcollector 5 located below that and the collector connection 6, is hereby illustrated in FIG. 1, The upper region of this heterobipolar transistor is surrounded by a trench with an insulator 7.

For the detection of the light radiated during a breakdown by the pn-junction to be monitored between the base and collector, a photodiode 8, the pn-junction of which can likewise be seen in the figure, is integrated in the vicinity of this junction, in the left part in FIG. 1. This photodiode 8 is connected to a control unit not shown in FIG. 1, which control unit controls the base current of the heterobipolar transistor in dependence on the photocurrent of the photodiode 8.

The control loop maintains the input parameter which is decisive for the semiconductor component to be monitored, that is to say the base current in the case of the heterobipolar transistor which is illustrated by way of example here, at a defined value in or shortly before breakdown. In the case of a MOSFET as the component to be monitored, the gate voltage can for example be controlled as the decisive input parameter.

The component can here be maintained both at the start of the breakdown or else in the breakdown. The determination of the working point for the control is left to the manufacturer or the user. The suggested method allows all possibilities.

FIG. 2 schematically shows the control unit 9, the photodiode 8 as well as the supply 10 for the pn-junction 11 to be monitored. The photocurrent generated in the photodiode 8 can, in the present example of the heterobipolar transistor, in the simplest case be passed for controlling to the base 2 as a second current portion (with inverted polarity). It is self evident however that a PID control of the base current is also possible, wherein the photocurrent of the photodiode 8 is used as control signal.

In the case of the suggested method, the light radiated by the semiconductor component, which has already passed a quality inspection, during operation is detected by means of an integrated photodetector and the detected signal is used to control the working point of the pn-junction. This control can be used in future oscillator circuits in transistors order to generate more power with the as the latter can be operated with the method without the danger of destruction defined in the breakdown.

REFERENCE LIST

1 Emitter
2 Base
3 Collector
4 SIC
5 Subcollector
6 Collector connection
7 Insulator
8 Photodiode
9 Control unit
10 Supply
11 pn-junction

The invention claimed is:

1. Method of enlarging an operating range of semiconductor components by monitoring a breakdown of pn-junctions in the semiconductor components during normal operation, in which, optical radiation, which the pn junction emits in the case of the breakdown, is detected with a photosensitive electronic component (8) integrated into the semiconductor component in the vicinity of the pn-junction to be monitored, and a voltage applied at the pn-junction or a current conducted across the pn-junction is controlled in dependence on the radiation detected in order to enlarge the operating range of the semiconductor components.

2. Method according to claim 1,
in which the voltage applied at the pn-junction or the current conducted across the pn-junction is controlled in dependence on the radiation detected in such a manner that a complete breakdown of the pn-junction is prevented.

3. Method according to claim 2,
in which the optical radiation is detected with a photodiode integrated into the semiconductor component.

4. Method according to claim 1,
in which the voltage applied at the pn-junction or the current conducted across the pn-junction is controlled in dependence on the radiation detected in order to control the breakdown of the pn-junction in a targeted manner.

5. Method according to claim 4,
in which the optical radiation is detected with a photodiode integrated into the semiconductor component.

6. Method according to claim 1,
in which the optical radiation is detected with a photodiode integrated into the semiconductor component.

7. Method according to claim 1 for monitoring the breakdown of pn-junctions in integrated circuits.

8. Semiconductor component with enlarged operating range with at least one pn-junction;
one control unit (9) for controlling a voltage applied at the pn-junction or a current conducted across the pn-junction and
one photosensitive electronic component (8) connected to the control unit (9), wherein the photosensitive electronic component is integrated into the semiconductor component in the vicinity of the pn-junction in such a manner that it can detect optical radiation emitted at the pn-junction during a breakdown during normal operation of the semiconductor component, and the control unit (9) controls the voltage applied at the pn-junction or the current conducted across the pn-junction in dependence on the radiation detected in order to enlarge the operating range of the semiconductor component.

9. Semiconductor component according to claim 8, in which the control unit (9) is constructed such that it prevents a complete breakdown of the pn-junction by means of the control.

10. Semiconductor component according to claim 9, in which the photosensitive electronic component (8) is a photodiode.

11. Semiconductor component according to claim 8, in which the control unit (9) is constructed such that it prevents the breakdown in a targeted manner in accordance with a stipulation by means of the control.

12. Semiconductor component according to claim 8, in which the photosensitive electronic component (8) is a photodiode.

13. Semiconductor component according to claim 12, in which the pn-junction is formed in a bipolar transistor.

14. Semiconductor component according to claim 12, in which the pn-junction is formed in a heterobipolar transistor (HBT).

15. Semiconductor component according to claim 8, in which the pn-junction is formed in a bipolar transistor.

16. Semiconductor component according to claim 8, in which the pn-junction is formed in a heterobipolar transistor (HBT).

17. Semiconductor component according to claim 8, in which the pn-junction is formed in a field effect transistor (FET), particularly MOSFET.

18. Semiconductor component according to claim 17, in which the control unit (9) is designed to control a source bulk or source drain or gate source voltage of the field effect transistor.

19. Semiconductor component according to claim 17, in which the pn-junction is formed in a field effect transistor (FET), particularly MOSFET.

* * * * *